(12) United States Patent
Sai et al.

(10) Patent No.: US 12,030,759 B2
(45) Date of Patent: Jul. 9, 2024

(54) STACKER CRANE

(71) Applicant: MURATA MACHINERY, LTD., Kyoto (JP)

(72) Inventors: Jun Sai, Ise (JP); Kazuhiro Ishikawa, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 294 days.

(21) Appl. No.: 17/778,615

(22) PCT Filed: Oct. 2, 2020

(86) PCT No.: PCT/JP2020/037613
§ 371 (c)(1),
(2) Date: May 20, 2022

(87) PCT Pub. No.: WO2021/106374
PCT Pub. Date: Jun. 3, 2021

(65) Prior Publication Data
US 2023/0002206 A1    Jan. 5, 2023

(30) Foreign Application Priority Data
Nov. 25, 2019   (JP) .................... 2019-212415

(51) Int. Cl.
*B66F 9/07*   (2006.01)
*B65G 1/04*   (2006.01)
*H01L 21/677*   (2006.01)

(52) U.S. Cl.
CPC ............ *B66F 9/07* (2013.01); *B65G 1/0407* (2013.01); *B65G 2249/02* (2013.01); *H01L 21/67766* (2013.01)

(58) Field of Classification Search
CPC ...................................................... B66F 9/07
See application file for complete search history.

(56) References Cited

U.S. PATENT DOCUMENTS

| | | | | |
|---|---|---|---|---|
| 6,105,727 A * | 8/2000 | Nakao | ........................ | B66F 9/07 |
| | | | | 187/250 |
| 8,056,681 B2 * | 11/2011 | Fukuda | ..................... | B66F 9/07 |
| | | | | 187/244 |
| 9,809,433 B2 * | 11/2017 | Tanaka | ..................... | B66F 9/07 |
| 10,083,851 B2 * | 9/2018 | Inada | ................ | H01L 21/68707 |
| 11,167,966 B2 * | 11/2021 | Tanaka | ..................... | B65G 1/04 |
| 11,705,359 B2 * | 7/2023 | Ide | .................... | H01L 21/67712 |
| | | | | 414/751.1 |

FOREIGN PATENT DOCUMENTS

JP    2004-091157 A    3/2004

* cited by examiner

*Primary Examiner* — Jonathan Snelting
(74) *Attorney, Agent, or Firm* — Keating & Bennett, LLP

(57) ABSTRACT

In a stacker crane, a cover to cover an elevation area of an elevation portion is integrally attachable to side surface portions of a mast, which includes a reinforcement portion and an adjuster. The reinforcement portion between a pair of the side surface portions in a Y direction extends toward an opposite direction to an elevation surface of an elevation surface defining portion and has a higher stiffness than that of each of the pair of side surface portions. The adjuster is spaced from the elevation surface defining portion in an X direction perpendicular to a Z direction and the Y direction, and both edges thereof extendible in the Y direction are contactable with the reinforcement portion and each of the pair of side surface portions.

14 Claims, 4 Drawing Sheets

STACKER CRANE

BACKGROUND OF THE INVENTION

1. Field of the Invention

An aspect of the present invention relates to a stacker crane.

2. Description of the Related Art

For example, as described in Japanese Unexamined Patent Application Publication No. 2004-91157, a stacker crane, of which an elevation portion (elevating platform) to transfer an article is movable vertically along a mast extending in a direction, is known. When the stacker crane is used, for example, in a clean room, it is required to prevent transfer or spreading of dust generated by vertical movements of an elevation portion along a mast.

SUMMARY OF THE INVENTION

In order to solve this problem, in a mast including a channel member that has a web part which is an elevation surface and a pair of flange portions which are side surfaces, a covering member that covers an elevation area of the elevation portion moving vertically along the elevation surface is considered to be attached integrally to the flange portions. With this configuration, the covering member is required to be attached so as not to interfere with the elevation portion so that a space between the covering member and the elevation portion can be as small as possible. However, the covering member could interfere with the elevation portion or the space between the covering member and the elevation portion could be larger due to a distortion of the mast itself or an attachment error of the mast. Therefore, a mast in which a position of the covering member that can be easily adjusted with respect to the elevation portion is required.

Preferred embodiments of the present invention provide stacker cranes each including a mast capable of easily adjusting a position relative to an elevation portion of a cover integrally attached at a side surface portion of the mast.

A stacker crane according to an aspect of a preferred embodiment of the present invention includes a mast including an elevation surface defining portion including an elevation surface extending in a first direction in which an elevation portion is movable up and down and in a second direction perpendicular or substantially perpendicular to the first direction and a pair of side surface portions extending in a third direction perpendicular or substantially perpendicular to the first direction and the second direction from both edges of the elevation surface defining portion in the second direction toward an opposite side to a side at which the elevation portion is located. The pair of side surface portions are structured such that a cover to cover an elevation area of the elevation portion is integrally attachable to the pair of side surface portions. The mast includes a reinforcement portion between the pair of side surface portions in the second direction, extending in the third direction from the elevation surface defining portion toward the opposite side to the side at which the elevation portion is located, and having a higher stiffness than that of the pair of side surface portions and an adjuster located to provide a clearance relative to the elevation surface defining portion in the third direction, the adjuster being capable of extending in the second direction, and provided so that both edges thereof contact with the reinforcement portion and the pair of side surface portions.

In the stacker crane with this configuration, the adjuster, which includes a telescopic structure and is between the side surface portion and the reinforcement portion having a higher stiffness than that of the side surface portion, is extended, so that the side surface portion of the mast is pushed out. The adjuster is shrunk, so that the side surface portion of the mast is pulled. In the mast with this configuration, an intersection angle α of the side surface portion with respect to the elevation surface defining portion is adjusted by pushing or pulling the side surface portion. Therefore, states (location and posture) of the cover attached integrally to the side surface portion are also changed (moved) according to the intersection angle. As a result, in the stacker crane including the mast including the pair of the side surface portions, a position relative to the elevation portion of the cover attached integrally to the side surface portion can be adjusted easily.

In a stacker crane according to an aspect of a preferred embodiment of the present invention, a portion of the mast may include the elevation surface defining portion, the pair of side surface portions and the reinforcement portion has an E shape or an approximate E shape in a plan view seen from the first direction.

In a stacker crane according to an aspect of a preferred embodiment of the present invention, the mast include a pair of flange portions connected to each other and standing up from both edges of a web portion provided on two channels, thus enabling the mast including the elevation surface defining portion, the pair of side surface portions, and the reinforcement portion to be formed easily.

A stacker crane according to an aspect of a preferred embodiment of the present invention may further include the cover provided so as to cover the elevation area of the elevation portion and attached integrally to the pair of side surface portions, thus enabling to prevent transfer or spreading of dust when the elevation portion moves up and down.

In a stacker crane according to an aspect of a preferred embodiment of the present invention, a fan filter may be provided in a recessed space defined by the elevation surface defining portion, the pair of side surface portions, and the reinforcement portion in a plan view seen from the first direction. With this configuration, the fan filter can be located between portions of the mast, thus allowing the total size of the mast to be compact.

According to aspects of preferred embodiments of the present invention, in stacker cranes each including a mast, a position relative to an elevation portion of a cover attached to side surface portions of the mast is able to be adjusted easily.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
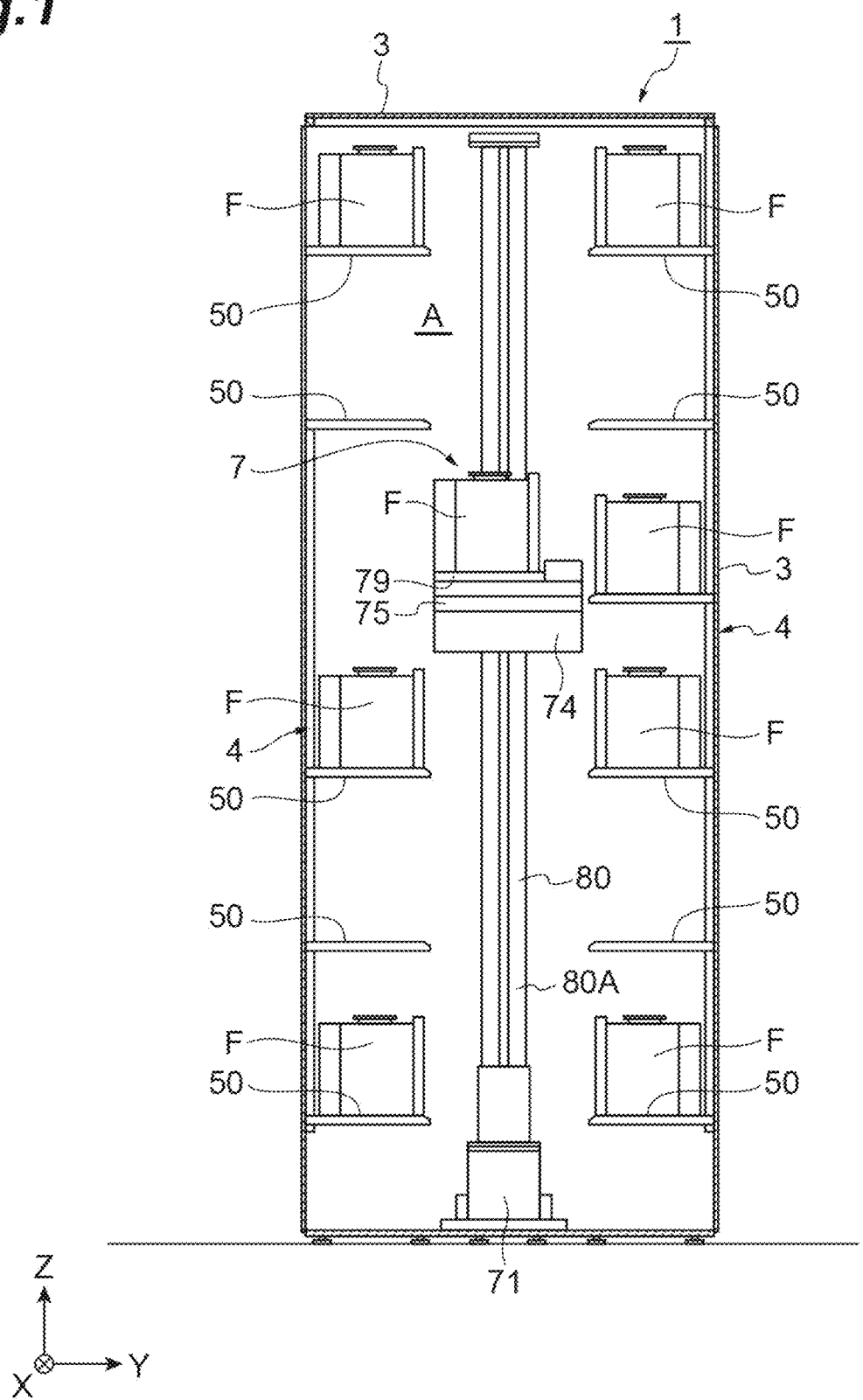
FIG. 1 is a sectional view showing a stocker including a stacker crane according to a preferred embodiment of the present invention.

Hereinafter, with reference to the drawings, preferred embodiments of aspects of the present invention will be described in detail. In the description of the drawings, the same elements are denoted by the same reference symbols, without redundant description. Words 'up' and 'down' correspond to an upper direction and a lower direction of a vertical direction, respectively.

A stocker 1 including a stacker crane 7 according to a preferred embodiment will be now described. As described FIG. 1, the stocker 1 functions as a storage to store a container F such as a FOUP (Front Opening Unified Pod) in which an object such as a semiconductor wafer or a glass substrate is stored. The stocker 1 is provided, for example, in a clean room. The stocker 1 mainly includes a stocker body 3, a rack 4, a stacker crane 7 and a controller (not illustrated).

The stocker body 3 demarcates an inner space A of the stocker 1 and is divided by a plurality of partitions. The rack 4 stores the container F and is generally arranged in one or two rows (in the present preferred embodiment, in two rows). The rack 4 extends in an X direction (a width direction) and two of the racks 4 adjacent to each other are arranged in parallel or substantially parallel so as to face each other. Each rack 4 includes a plurality of shelves 50 where the container F is placed and stored. The shelves 50 are arranged along the X direction and a Z direction (a vertical direction).

The stacker crane 7 is a mechanism to load/unload the container F to/from each of the shelves 50 as well as to transfer between a loading port and an unloading port (not illustrated) and each of the shelves 50 or between the shelves 50. The stacker crane 7 is located at an area between two of the racks 4 facing each other. The stacker crane 7 is capable of traveling on a rail (not illustrated) provided on a floor along an extending direction (the X direction) of the rack 4 to move along the rack 4 in the X direction.

Figure 2:
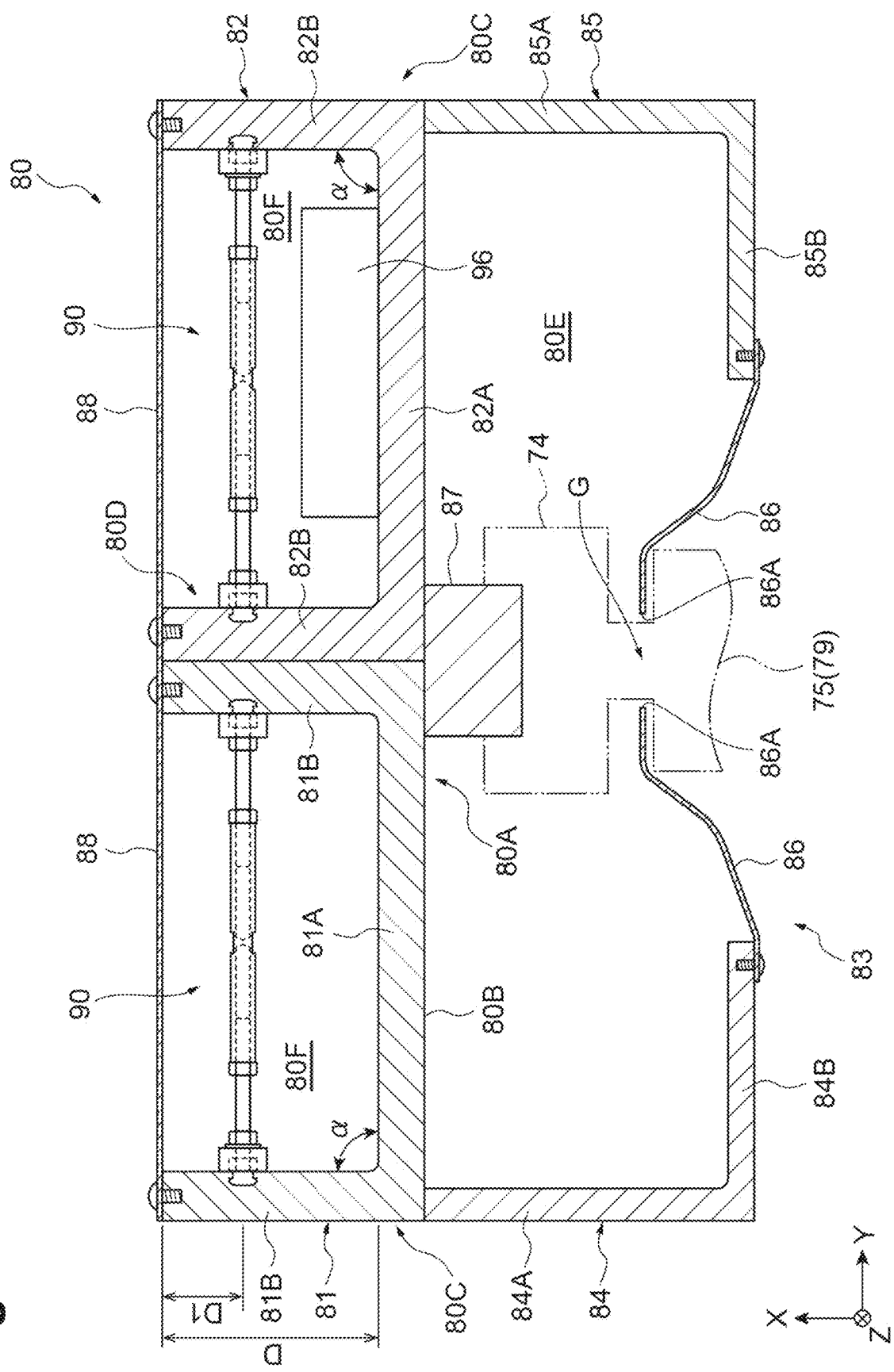
FIG. 2 is a sectional view showing a mast and a cover unit of the stacker crane of FIG. 1.

As shown in FIG. 1 and FIG. 2, the stacker crane 7 includes a travel unit 71, a mast 80, an elevation portion 74, a rotation unit 75, a hand 79, a cover unit (cover) 83 and FFU (Fan Filter Unit or Fan Filter) 96. The travel unit 71 is capable of traveling along a rail in the X direction by a travel driver such as a motor. The elevation portion 74 is movable up and down along an elevation surface 80B of the mast 80. The mast 80 which is disposed at the travel unit 71 extends in the Z direction (a first direction). The elevation portion 74 is capable of moving up and down along the mast 80 by an elevation driver such as a motor. The rotation unit 75 rotates the hand 79 mounted on the rotation unit 75 around an axis along Z direction.

The hand 79 on which the container F is placed is provided at the elevation portion 74. The hand 79 moves in and out (inside and outside the elevation portion 74 in a plan view) to transfer the container F with a transfer device (not illustrated). It is to be noted that configurations, mechanisms, and locations of the travel unit 71, the elevation portion 74, the rotation unit 75, and the hand 79 are not specifically limited. Any known mechanisms or devices are adoptable for the travel unit 71, the elevation portion 74, the rotation unit 75, and the hand 79.

The controller is configured or programmed to control components or portions of the stacker crane 7. The controller is located, e.g., in the stocker body 3. The controller may include a CPU (Central Processing Unit), RAM (Random Access Memory), and ROM (Read Only Memory). The controller be configured or programmed to perform control operations in cooperation between hardware such as CPU, RAM, and ROM, and software such as a program.

As shown in FIG. 2, the mast 80 includes two channel members 81, 82, a slide rail 87, a back cover 88, and two adjusting members 90. In the mast 80, an elevation surface forming portion 80A, a pair of side surface portions 80C, 80C, and a reinforcement 80D are formed with the two channel members 81, 82.

The elevation surface forming portion 80A includes the elevation surface 80B extending in the Z direction and the Y direction (a second direction), the elevation surface along which the elevation portion 74 moves up and down. In other words, the elevation surface 80B is perpendicular or substantially perpendicular to the X direction. The pair of side surface portions 80C, 80C extend in the X direction from both edges of the elevation surface forming portion 80A in the Y direction toward an opposite side of a side at which the elevation portion 74 is located. The reinforcement portion 80D is arranged between the pair of side surface portions 80C, 80C in the Y direction and extends in the X direction from a side opposite to the elevation surface 80B of the elevation surface forming portion 80A toward an opposite side of a side at which the elevation portion 74 is located. The reinforcement portion 80D is formed so as to have a higher stiffness than that of each of the side surface portions 80C, 80C.

The elevation surface forming portion 80A, the pair of side surface portions 80C, 80C, and the reinforcement 80D are formed with two channel members 81, 82. The channel member 81 includes a web part 81A and a pair of flange portions 81B, 81B extending (erecting) in the X direction from both edges of the web part 81A in the Y direction. The channel member 82 includes a web part 82A and a pair of flange portions 82B, 82B extending (erecting) in the X direction from both edges of the web part 82A in the Y direction. The channel member 81 and the channel member 81 preferably are the same or substantially the same in size and shape. Thus, the web part 81A and the web part 82A have the same or substantially the same thickness and the flange portion 81B and the flange portion 82B have the same or substantially the same thickness.

The channel member 81 and the channel member 82 are made of, e.g. a stainless steel which is a low-cost metal with high stiffness. The flange portion 81B of the channel member 81 and the flange portion 82B of the channel member 82 are jointed with each other so that the web part 81A of the channel member 81 and the web part 82A of the channel member 82 can be flush. The web part 81A of the channel member 81 and the web part 82A of the channel member 82 being flush forms the elevation surface 80B of the mast 80. One of the flange portion 81B of the channel member 81 forms the one of the side surface portion 80C of the mast 80 and the other of the flange portion 82B of the channel member 82 forms the other of the side surface portion 80C of the mast 8. The reinforcement portion 80D of the mast 80 is formed by a joint between the other of the flange portion 81B of the channel member 81 and the other of the flange portion 81B of the channel member 82.

A portion of the mast, which includes the elevation surface forming portion 80A, the pair of side surface portions 80C, 80C, and the reinforcement portion 80D, is formed in an E shape or an approximate E shape in a plan view seen from Z direction.

A slide rail 87 extending in the Z direction and used for the elevation portion 74 is fixed to the elevation surface 80B of the elevation surface forming portion 80A.

The cover unit 83 covers an elevation area 80E of the elevation portion 74. The cover unit 83 includes two angle members 84, 85 and two covers 86. The cover unit 83 is attached integrally to each of the pair of side surface portions 80C, 80C with a coupler (not illustrated). In particular, the angle member 84 is attached integrally to the channel member 81 and the angle member 85 is attached integrally to the channel member 82.

The angle member 84 and the angle member 85 are made of, e.g., a stainless steel which is a low-cost metal with high stiffness. The angle member 84 includes a first surface 84A and a second surface 84 B perpendicular or substantially perpendicular to the first surface 84 A. The first surface 84A is attached integrally to the flange portion 81B of the channel member 81. The cover 86 is attached to a top edge of the second surface 84B. The angle member 85 includes a first surface 85A and a second surface 85B perpendicular to the first surface 85A. The first surface 85A is attached integrally to the flange portion 82B of the channel member 82. The cover 86 is attached to a top edge of the second surface 85B. The cover 86 is made of an aluminum plate, for example.

A gap G is formed between a top edge 86A of the cover 86 attached to the angle member 84 and a top edge 86A of the cover 86 attached to the angle member 85 in the Y direction. The rotation unit 75 and the hand 79 protrudes to an outer space from the elevation portion 74 placed within the elevation area 80E through the space G. In the present preferred embodiment, the top edge 86A of the cover 86 is provided so as not to interfere with the elevation portion 74, the rotation unit 75, and the hand 79.

The back cover 88 is provided at a back side of the mast 80. The back cover 88 is attached to top edges of the pair of flange portions 81B, 81B of the channel member 81 and top edges of the pair of flange portions 82B, 82B of the channel member 82. A recessed space 80F is formed with the web part 81A, the pair of flange portions 81B, 81B, and the back cover 88. The recessed space 80F is also formed with the web part 82A, the pair of flange portions 82B, 82B, and the back cover 88.

For example, each of the adjusting members 90 extends in the Y direction and includes a turnbuckle member stretchable in the Y direction. The adjusting members 90 are arranged in the recessed space 80F. In particular, the adjusting members 90 are spaced away from the elevation surface forming portion 80A in the X direction (a third direction). The adjusting members 90 are arranged in two rows in the Y direction. One of the adjusting members 90 is provided so that both edges thereof can contact with one of the flange portion 81B forming the reinforcement portion 80D and the other of the flange portion 81B forming the side surface portion 80C, and the other of the adjusting members 90 is provided so that both edges thereof can contact with one of the flange portion 82B forming the reinforcement portion 80D and the other of the flange portion 82B forming the side surface portion 80C. A total length of the channel member 81 (82) in the X direction is referred to as D and a distance between each adjusting member 90 and the back cover 88 is referred to as D1. Each adjusting member 90 is located so that D1 can be equal to or shorter than a half of D (D1≤½D). Without any back cover 88, the adjusting members 90 may be provided so that top edges of the pair of flange portions 81B, 81B (82B, 82B) can contact with each other.

Figure 3:
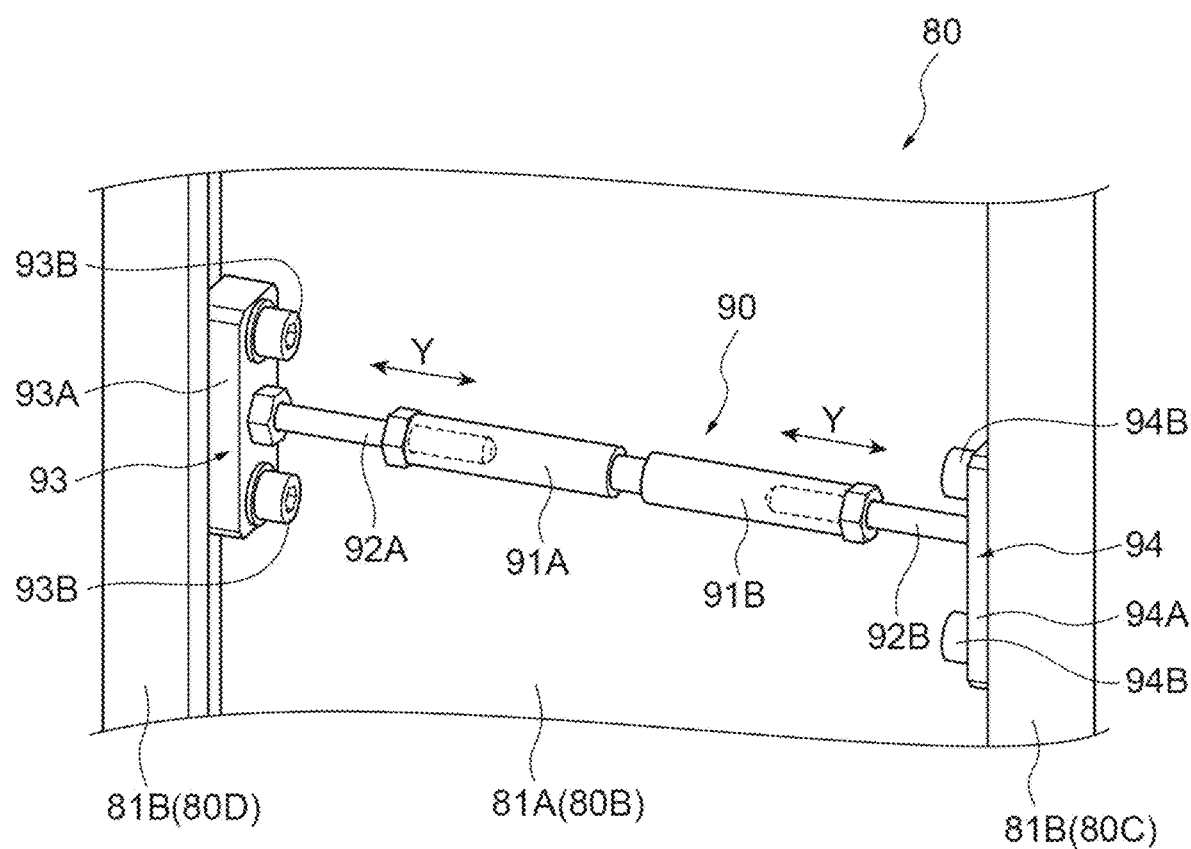
FIG. 3 is a perspective view showing an adjusting member of the mast shown in FIG. 2.

As shown in FIG. 3, each adjusting member 90 includes a body 91A, 91B, a first screw bolt 92A screwing into a thread groove formed at a hole of the body 91A, a second screw bolt 92B screwing into a thread groove formed at a hole of the body 91B, an anchor 93 provided at a top edge of the first screw bolt 92A, and an anchor 94 provided at a top edge of the second screw bolt 92B. The anchor 93 (94) is provided with a bolt 93B (94B) to be fixed to the flange portion 81B.

The two adjusting members 90 can adjust an intersection angle α (see FIG. 2) of the pair of side surface portions 80C, 80C with respect to the elevation surface forming portion 80A by rotating the first screw bolt 92A and the second screw bolt 92B screwed by the bodies 91A, 91B, respectively. Hereinafter, with reference to FIG. 3 and FIGS. 4A to 4C, a method of adjusting the intersection angle α of the pair of the side surface portions 80C, 80C with respect to the elevation surface forming portion 81A will now be described in detail.

The adjusting members 90 act so as to push out one of the flange portion 81B and one of the flange portion 82B (corresponding to the side surface portion 80C) in a direction away from the other of the flange portion 81B and the other of the flange portion 82B (corresponding to the reinforcement portion 80D) by rotating a top edge (anchor 93) of the first screw bolt 92A in a direction away from the body 91A and rotating top edge (anchor 94) of the second screw bolt 92B in a direction away from the body 91B. A location and a posture of the first surface 84A of the angle member 84 change so as to be flush with one of the flange portion 81B and a location and a posture of the first surface 85A of the angle member 85 change so as to be flush with one of the flange portion 82B, thus changing the pair of the side surface portions 80C, 80C from a state shown in FIG. 4A to a state shown in FIG. 4B. Thus, the pair of the side surface portions 80C, 80C is deformed such that a back side of the mast 80 opens (moves farther from each other). The deformation of the mast 80 changes a location and a posture of the cover unit 83. Therefore, the first screw bolt 92 A and the second screw bolt 92B are adjusted, so that positions and postures of one of the flange portion 81B and one of the flange portion 82B, the first surface 84A and the second surface 84B of the angle member 84, and the first surface 85A and the second surface 85B of the angle member 85 are changed, as a result, the gap G between top edges of two of the cover 86 becomes narrower than its original state.

Further, the adjusting member 90 acts so as to pull one of the flange portion 81B and one of the flange portion 82B (corresponding to the side surface portion 80C) in an approaching direction to the other of the flange portion 81B and the other of the flange portion 82B (corresponding to the reinforcement portion 80D) by rotating a top edge of the first screw bolt 92A (anchor 93) in an approaching direction to the body 91A and rotating a top edge of the second screw bolt 92B (anchor 94) in an approaching direction to the body 91B. A location and a posture of the first surface 84A of the angle member 84 change so as to be flush with one of the flange portion 81B and a location and a posture of the first surface 85A of the angle member 85 change so as to be flush with one of the flange portion 82B, thus changing the pair of the side surface portions 80C, 80C from the state shown in FIG. 4A to a state shown in FIG. 4C. Therefore, the pair of the side surface portions 80C, 80C are deformed such that a side of the elevation surface 80B of the mast 80 closes (approaches to each other). The deformation of the mast 80 changes a location and a posture of the cover unit 83. Therefore, the first screw bolt 92A and the second screw bolt 92B are adjusted, so that locations and postures of one of the flange portion 81B, one of the flange portion 82B, the first surface 84A and the second surface 84B of the angle member 84, and the first surface 85A and the second surface 85B of the angle member 85 are changed, as a result, the gap G between top edges of two of the cover 86 becomes wider than its original state.

In the present preferred embodiment, as described above, the gap G between top edges of two of the cover 86 becomes narrower than its original state by rotating a top edge (anchor 93) of the first screw bolt 92A so as to keep away from the body 91A and rotating top edge (anchor 94) of the second screw bolt 92B so as to keep away from the body 91B, and the gap G between top edges of two of the covers 86 becomes wider than its original state by rotating a top edge (anchor 93) of the first screw bolt 92A so as to keep close to the body 91A and rotating a top edge of the second screw bolt 92B (anchor 94) so as to keep close to the body 91B. However, whether the gap G between the top edges of two of the cover 86 becomes narrower or wider than its original state may depend on a shape of the cover 86 attached to the second surface 84B of the angle member 84 and the second surface 85B of the angle member 85.

Figure 4A:
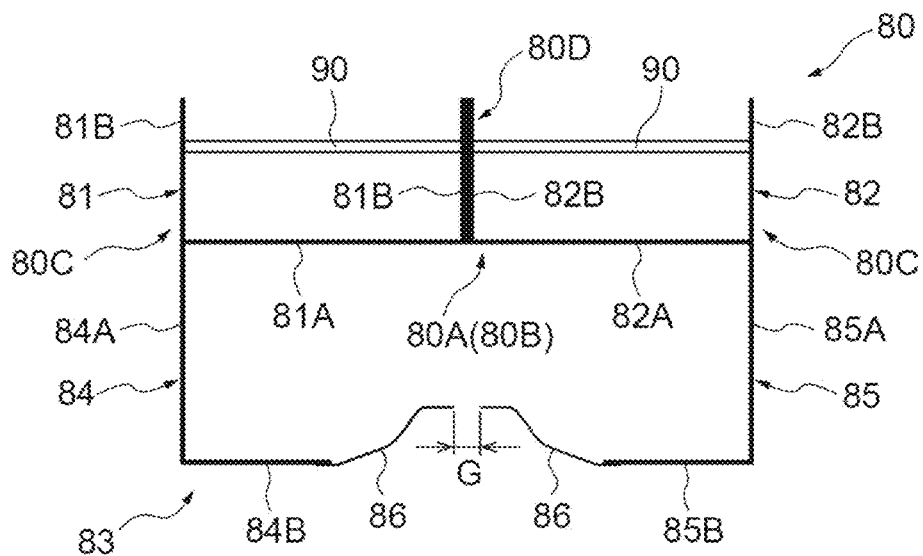
FIGS. 4A to 4C are views showing states of side surface portions of the mast and the cover unit changed by the adjusting member.
Figure 4B:
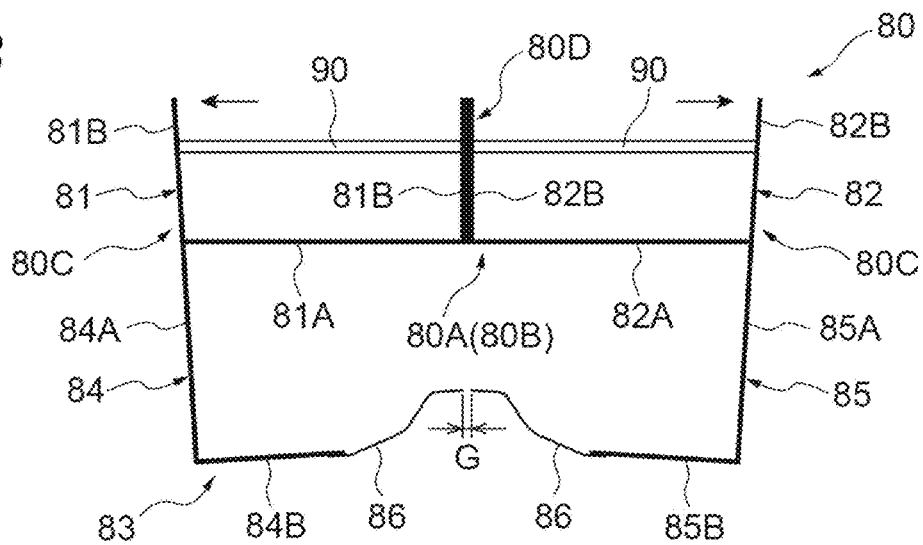
Figure 4C:
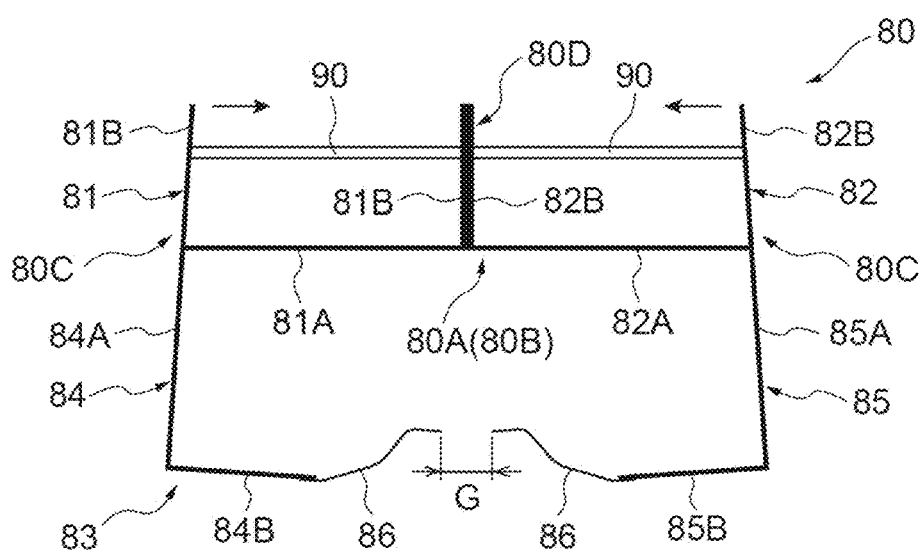

With reference to FIGS. 4B and 4C, as described above, both of top edges of the first screw bolt 92A and the second screw bolt 92B are moved so as to keep away from each of the bodies 91A, 91B or to keep close to each of the bodies 91A, 91B. However, only one of the top edge of the first screw bolt 92A and the top edge of the second screw bolt 92B may be moved to keep away from the body 91A or the body 91B or keep close to the body 91A or the body 91B. In addition, one of the top edge of the first screw bolt 92A and one of the top edge of the second screw bolt 92B may be moved to keep away from the body 91A and the body 91B, or the other of the top edge of the first screw bolt 92A and the other of the top edge of the second screw bolt 92B may be moved to keep close to the body 91A or the body 91B. These adjustments of the adjusting member 90 can adjust a relative position of the cover 86 to the elevation portion 74.

As described above, the two adjusting members 90 have an adjustment function to adjust the intersection angle α of the pair of side surface portions 80C, 80C with respect to the elevation surface forming portion 80A. The two adjusting members 90 also have a reinforcement function to reinforce a stiffness of the mast 80 overall. The two adjusting members 90 are arranged at a predetermined interval in a direction in which the mast 80 extends. The number of adjusting members 90 to be arranged is set appropriately according to ease of deformation of the pair of the side surface portions 80C, 80C of a member of the mast 80.

As shown in FIG. 2, the FFU 96 is arranged in the recessed space 80. In detail, the FFU 96 is arranged in the recessed space 80 formed with the elevation surface forming portion 80A, the side surface portion 80C and the reinforcement portion 80D in a plan view seen from Z direction. The FFU 96 is an air cleaning device with a fan and a filter to draw in ambient air and discharge purified air.

Actions and effects of the stacker crane 7 according to the above preferred embodiment will now be described. In the stacker crane 7 according to the above preferred embodiment, the adjusting member 90 which includes a stretchable member is provided between the side surface portion 80C and the reinforcement portion 80D having a higher stiffness than that of the side surface portion 80C, so that the side surface portion 80C of the mast 80 is pushed out by extension of the adjusting member 90 so as to keep away from the reinforcement portion 80D, and the side surface portion 80C of the mast 80 is pulled by contraction of the adjusting member 90 so as to keep close to the reinforcement portion 80D. In the mast with this configuration, the intersection angle α of the side surface portion 80C with respect to the elevation surface forming portion 80A is adjusted by pushing or pulling the side surface portion 80C. Thus, states (position and posture) of the cover unit 83 attached integrally to the side surface portion is also changed (moved) according to the intersection angle α. As a result, in the stacker crane 7 including the mast 80 provided with the pair of side surface portions 80C, 80C, a position (a relative position to the elevation portion 74) of the cover unit 83 attached to the side surface portion 80C can be adjusted easily.

In the stacker crane 7 according to the above preferred embodiment, a position of the cover unit 83 relative to the elevation portion 74 can be adjusted easily, so that the cover 86 can be placed at a marginal position so as not to interfere with the elevation portion 74 which is moving up and down, thus preventing dust from flowing into the inner space A of the stocker 1 due to contact between the elevation portion 74 and the cover 86 and preventing dust generated at the elevation area 80E.

In the stacker crane 7 according to the above preferred embodiment, the adjusting member 90 is provided, so that the stiffness of the mast 80 is increased as a whole. Further, the adjusting member 90 is provided, so that the stiffness of the entire mast 80 can be increased, thus allowing a total size of the mast 80 to be smaller if the mast 80 has the same performance.

In the stacker crane 7 according to the above preferred embodiment, the mast 80 is formed by connection between the flange portions 81B and 82B of two channel members 81, 82 including the web part 81A (82A) and the pair of flange portions 81B, 81B (82B, 82B) erecting from the both edges of the web part 81A (82A). Therefore, the mast 80 can be formed easily with the elevation surface forming portion 80A, the pair of side surface portions 80C, 80C, and the enforcement portion 80D.

In the stacker crane 7 according to the above preferred embodiment, the cover unit 83 to cover the elevation area 80E of the elevation portion 74 is provided, thus preventing generation or transmission of dust in the inner space A of the stocker 1 when the elevation portion 74 moves up and down.

In the stacker crane 7 according to the above preferred embodiment, the FFU 96 is placed in the recessed space 80F formed with the elevation surface forming portion A, the side surface portion 80C, and the reinforcement portion 80D in a plan view seen from Z direction. Therefore, the FFU 96 can be placed between members of the mast 80, as a result, allowing a total size of the mast 80 to be compact.

Preferred embodiments were described above, however, aspects of the present invention are not limited to the above preferred embodiments. Any changes can be made without departing from the scope of the present invention.

In the stacker crane 7 according to the above preferred embodiments, the mast with an E shape or an approximate E shape in a plan view seen from the Z direction is defined by a connection between two channel members 81, 82, however, it is not limited thereto. For example, a single structure with an E-shaped cross section or a substantially E-shaped cross section may be used. Further, a structure with a C-shaped cross section or a substantially C-shaped cross section is integrally welded with a structure which functions as the reinforcement portion 80D to form an E shape or an approximate E-shape, which may be used.

In the above preferred embodiments, the surfaces of the channel members 81, 82 and the angle members 84, 85 may have a flat plate shape, however, a groove may be provided on each of the surfaces of these members.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A stacker crane, comprising:
 a mast including an elevation surface defining portion including an elevation surface extending in a first direction in which an elevation portion moves up and down and in a second direction perpendicular or substantially perpendicular to the first direction and a pair of side surface portions extending in a third direction perpendicular or substantially perpendicular to the first direction and the second direction from both edges of the elevation surface defining portion in the second direction toward an opposite side to a side at which the elevation portion is located; wherein
 the pair of side surface portions are structured such that a cover to cover an elevation area of the elevation portion is integrally attachable to the pair of side surface portions; and
 the mast includes:
  a reinforcement portion between the pair of side surface portions in the second direction, extending in the third direction from the elevation surface defining portion toward the opposite side to the side at which the elevation portion is located, and having a higher stiffness than that of the pair of side surface portions; and
  an adjuster located to provide a clearance with respect to the elevation surface defining portion in the third direction, the adjuster being capable of extending in the second direction, and provided so that both edges thereof contact with the reinforcement portion and the pair of side surface portions.

2. The stacker crane according to claim 1, wherein a portion of the mast, the pair of side surface portions, and the reinforcement portion has an E shape or an approximate E shape in a plan view seen from the first direction.

3. The stacker crane according to claim 2, wherein the mast includes a pair of flange portions connected to each other and standing up from both edges of a web portion provided on two channels.

4. The stacker crane according to claim 3, further comprising the cover provided so as to cover the elevation area of the elevation portion and attached integrally to the pair of side surface portions.

5. The stacker crane according to claim 4, wherein a fan filter is in a recessed space defined by the elevation surface defining portion, the pair of side surface portions, and the reinforcement portion in a plan view seen from the first direction.

6. The stacker crane according to claim 3, wherein a fan filter is in a recessed space defined by the elevation surface defining portion, the pair of side surface portions, and the reinforcement portion in a plan view seen from the first direction.

7. The stacker crane according to claim 2, further comprising the cover provided so as to cover the elevation area of the elevation portion and attached integrally to the pair of side surface portions.

8. The stacker crane according to claim 2, wherein a fan filter is in a recessed space defined by the elevation surface defining portion, the pair of side surface portions, and the reinforcement portion in a plan view seen from the first direction.

9. The stacker crane according to claim 1, wherein the mast includes a pair of flange portions connected to each other and standing up from both edges of a web portion on two channels.

10. The stacker crane according to claim 9, further comprising the cover provided so as to cover the elevation area of the elevation portion and attached integrally to the pair of side surface portions.

11. The stacker crane according to claim 9, wherein a fan filter is in a recessed space defined by the elevation surface defining portion, the pair of side surface portions, and the reinforcement portion in a plan view seen from the first direction.

12. The stacker crane according to claim 1, further comprising the cover provided so as to cover the elevation area of the elevation portion and attached integrally to the pair of side surface portions.

13. The stacker crane according to claim 12, wherein a fan filter is in a recessed space defined by the elevation surface defining portion, the pair of side surface portions, and the reinforcement portion in a plan view seen from the first direction.

14. The stacker crane according to claim 1, wherein a fan filter is in a recessed space defined by the elevation surface defining portion, the pair of side surface portions, and the reinforcement portion in a plan view seen from the first direction.

* * * * *